US012640720B2

(12) United States Patent
Bernardon et al.

(10) Patent No.:    US 12,640,720 B2
(45) Date of Patent:        May 26, 2026

(54) POWER ELECTRONICS DEVICE AND SENSING METHOD FOR A GaN DIE INCLUDED IN THE POWER ELECTRONICS DEVICE

(71) Applicant: Infineon Technologies Austria AG, Villach (AT)

(72) Inventors: Derek Bernardon, Villach (AT); Thomas Ferianz, Bodensdorf (AT); Filipe Esteves Tavora, Villach (AT)

(73) Assignee: Infineon Technologies Austria AG, Villach (AT)

( * ) Notice:    Subject to any disclaimer, the term of this patent is extended or adjusted under 35 U.S.C. 154(b) by 459 days.

(21) Appl. No.: 18/455,915

(22) Filed:    Aug. 25, 2023

(65)    Prior Publication Data

US 2025/0070770 A1    Feb. 27, 2025

(51) Int. Cl.
| | |
|---|---|
| *H03K 17/041* | (2006.01) |
| *H02H 9/02* | (2006.01) |
| *H03K 17/081* | (2006.01) |
| *H03K 17/687* | (2006.01) |

(52) U.S. Cl.
CPC ......... *H03K 17/04106* (2013.01); *H02H 9/02* (2013.01); *H03K 17/08104* (2013.01); *H03K 17/687* (2013.01); *H03K 2217/0027* (2013.01)

(58) Field of Classification Search
CPC ....... H03K 17/04106; H03K 17/08104; H03K 17/687; H02H 9/02
See application file for complete search history.

(56)    References Cited

U.S. PATENT DOCUMENTS

| | | | |
|---|---|---|---|
| 5,621,601 | A | 4/1997 | Fujihira et al. |
| 8,054,059 | B2 | 11/2011 | Wu |
| 9,335,779 | B2 | 5/2016 | Sambucco |
| 9,519,303 | B2 | 12/2016 | Ballarin et al. |
| 9,664,713 | B2 | 5/2017 | Sambucco et al. |
| 9,798,347 | B2 | 10/2017 | Sambucco et al. |
| 10,794,982 | B2 | 10/2020 | Newlin |
| 11,251,622 | B1 | 2/2022 | Sherwood et al. |
| 2014/0320095 | A1 | 10/2014 | Sambucco |
| 2016/0124027 | A1 | 5/2016 | Sambucco et al. |
| 2017/0077923 | A1 | 3/2017 | Sambucco |
| 2017/0093387 | A1* | 3/2017 | Zhu ...................... H03K 5/2472 |
| 2019/0140630 | A1* | 5/2019 | Chen ................ H03K 17/08104 |
| 2020/0366281 | A1* | 11/2020 | Iwata ................... H10D 89/601 |

(Continued)

*Primary Examiner* — Scott Bauer
(74) *Attorney, Agent, or Firm* — Murphy, Bilak & Homiller, PLLC

(57)    ABSTRACT

A power electronics device includes first and second semiconductor dies. The first die includes: a main GaN power transistor; a first GaN current sense transistor having a source electrically connected to a second current sense terminal; a second GaN current sense transistor; a diode device electrically connected in series between the drains of the main GaN power transistor and second GaN current sense transistor; and a voltage protection device electrically connecting the drain of the second GaN current sense transistor to a first current sense terminal. The second die includes current sense and short circuit detection circuits electrically connected to the current sense terminals. The short circuit detection circuit detects when the drain current of the main GaN power transistor exceeds a predetermined value and when the main GaN power transistor is in saturation.

18 Claims, 2 Drawing Sheets

(56) References Cited

U.S. PATENT DOCUMENTS

| | | | | |
|---|---|---|---|---|
| 2022/0182048 | A1* | 6/2022 | Liu ........................ | H03K 17/14 |
| 2023/0408556 | A1* | 12/2023 | Qu ..................... | G01R 19/0092 |
| 2024/0072530 | A1* | 2/2024 | Forejtek ............. | H03K 17/0822 |

* cited by examiner

POWER ELECTRONICS DEVICE AND SENSING METHOD FOR A GaN DIE INCLUDED IN THE POWER ELECTRONICS DEVICE

BACKGROUND

GaN (gallium nitride) technology enables higher switching frequencies, e.g., above 200 to 250 kHz. Many power electronics applications approach such high frequencies with low operational duty cycles, making it significantly more difficult to have accurate current sensing that is fast enough to track the current through a GaN power device that is in the ON phase for very short times. Another problem is the aging of the main GaN power device with respect to the sense device which results in decreasing current sense accuracy over time. A further problem is sensing voltages that can go up to 600V or higher with a low voltage technology such as Si (silicon). Another issue is accurate drain voltage sensing and saturation detection for the main GaN power device, without increasing the complexity or terminal count of the die (chip).

Thus, there is a need for improved current sensing technology of GaN dies.

SUMMARY

According to an embodiment of a power electronics device, the power electronics device comprises: a first semiconductor die comprising: a first current sense terminal; a second current sense terminal; a main GaN (gallium nitride) power transistor; a first GaN current sense transistor having a source electrically connected to the second current sense terminal and a drain electrically connected to a drain of the main GaN power transistor; a second GaN current sense transistor having a source electrically connected to a source of the main GaN power transistor; a diode device electrically connected in series between the drain of the main GaN power transistor and a drain of the second GaN current sense transistor; and a voltage protection device electrically connecting the drain of the second GaN current sense transistor to the first current sense terminal; a second semiconductor die comprising a current sense circuit and a short circuit detection circuit electrically connected to the first and second current sense terminals of the first semiconductor die, wherein the short circuit detection circuit is configured to detect when the drain current of the main GaN power transistor exceeds a predetermined value and when the main GaN power transistor is in saturation.

According to an embodiment of a sensing method for a GaN (gallium nitride) die that includes a main GaN power transistor, a first GaN current sense transistor having a source electrically connected to a second current sense terminal of the GaN die and a drain electrically connected to a drain of the main GaN power transistor, a second GaN current sense transistor having a source electrically connected to a source of the main GaN power transistor, a diode device electrically connected in series between the drain of the main GaN power transistor and a drain of the second GaN current sense transistor, and a voltage protection device electrically connecting the drain of the second GaN current sense transistor to a first current sense terminal of the GaN Die, the sensing method comprises: sensing a scaled-down replica of current flowing in the main GaN power transistor based on a voltage at the first current sense terminal of the GaN die and a voltage at the second current sense terminal of the GaN die; detecting when the main GaN power transistor is in saturation based on the voltage at the first current sense terminal of the GaN die and a first reference voltage; and detecting when the drain current of the main GaN power transistor exceeds a predetermined value based on the voltage at the second current sense terminal of the GaN die and a second reference voltage.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein are embodiments of a power electronics device and sensing method for a GaN die (chip) included in the power electronics device, using a second die that includes a current sense circuit and a short circuit detection circuit electrically connected to current sense terminals of the GaN die. The short circuit detection circuit is configured to detect when the drain current of the main GaN power transistor exceeds a predetermined value and when the main GaN power transistor is in saturation. Immediate corrective action can be taken when the short circuit detection circuit detects either condition, e.g., by overriding the gate drive signal to shut down the main GaN power transistor. The GaN die has current sense readout circuitry with low voltage protection that enables current sensing with a low voltage technology such as Si (silicon).

Described next, with reference to the figures, are exemplary embodiments of the power electronics device and corresponding sensing method.

Figure 1:
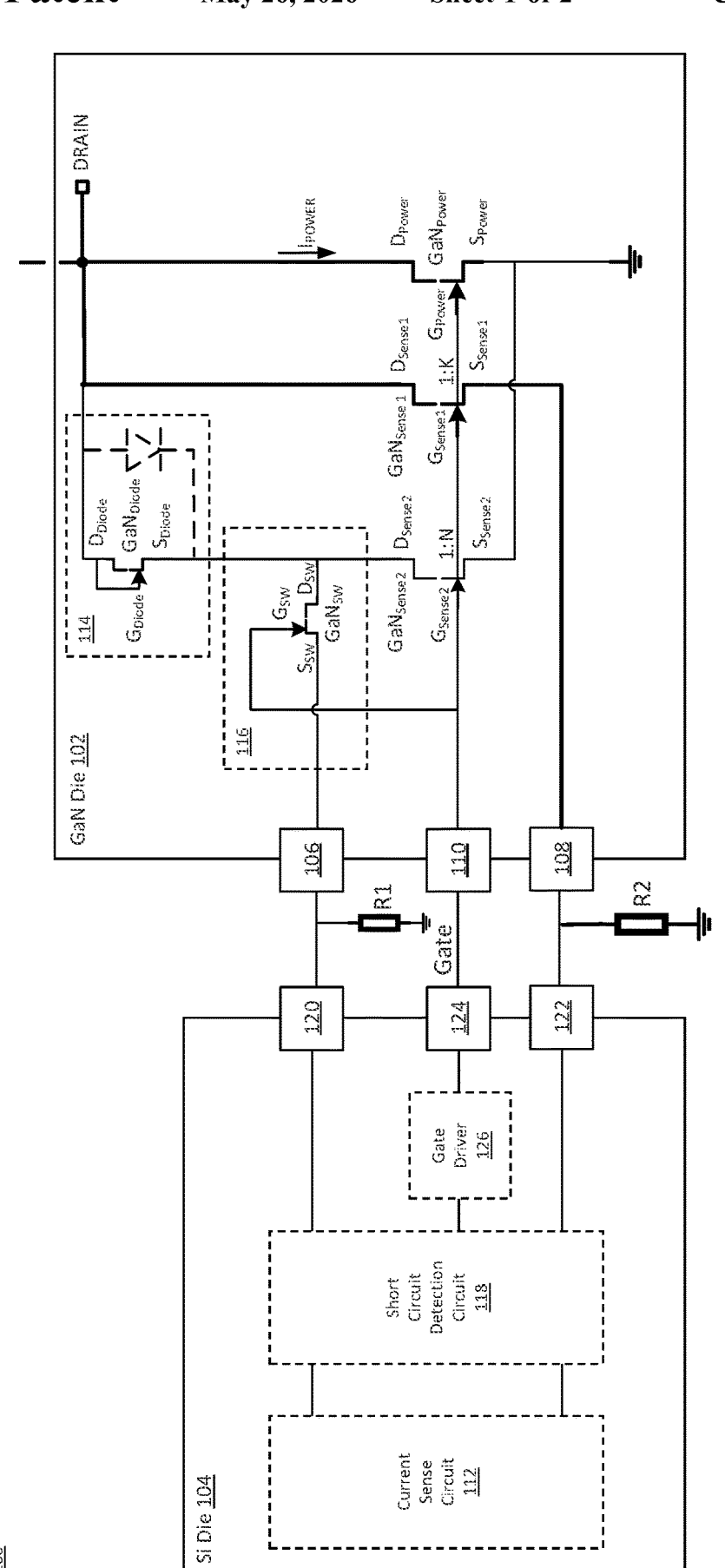
FIG. 1 illustrates a schematic diagram of an embodiment of a power electronics device that includes a first semiconductor die with a GaN power transistor and GaN current sense transistors, and a second semiconductor die with current sense and short circuit detection circuits.

FIG. 1 illustrates an embodiment of a power electronics device 100. The power electronics device 100 includes a first semiconductor die 102 and a second semiconductor die 104. The first and second semiconductor dies 102, 104 may be co-packaged in the same package, assembled in the same module, or attached to the same circuit board.

The first semiconductor die 102 is a GaN (gallium nitride) die that includes GaN devices. The second semiconductor die 104 is a Si (silicon) die that includes Si devices. The power electronics device 100 may utilize other semiconductor technologies such as SiC, for example. Accordingly, the function of the devices included in the power electronics device 100 are technology independent but described herein in the context of GaN technology for the first semiconductor die 102 and in the context of Si technology for the second semiconductor die 104. As such, the transistors, diode devices, etc. described herein and that are included in the power electronics device 100 may be GaN devices, Si devices, SiC devices, etc.

With this understanding, the GaN die 102 includes a first current sense terminal 102, a second current sense terminal

104, a main GaN power transistor $GaN_{POWER}$, a first GaN current sense transistor $GaN_{SENSE1}$, and a second GaN current sense transistor $GaN_{SENSE2}$. The GaN die 102 includes additional terminals such as a gate (control) terminal 110. The terminals 106, 108, 110 may be bond (contact) pads, pins, balls, columns, etc. at the frontside and/or backside of the GaN die 102, for example. The on/off state of the GaN current sense transistors $GaN_{SENSE1}$, $GaN_{SENSE2}$ and the main GaN power transistor $GaN_{POWER}$ is controlled by a gate signal 'Gate' that drives the common (shared) gate terminal 110 of the GaN die 102.

The main GaN power transistor $GaN_{POWER}$ included in the GaN die 102 may be part of a low-side switch device of any type of power electronics device that operates at a relatively high frequency, e.g., above 200 to 250 kHz and which requires accurate current sensing. For example, the main GaN power transistor $GaN_{POWER}$ may be part of a low-side switch for a power, boost converter, Flyback converter, PFC (power factor correction) stage, etc.

The source $S_{SENSE1}$ of the first GaN current sense transistor $GaN_{SENSE1}$ is electrically connected to the second current sense terminal 108. The drain $D_{SENSE1}$ of the first GaN current sense transistor $GaN_{SENSE1}$ is electrically connected to the drain $D_{POWER}$ of the main GaN power transistor $GaN_{POWER}$. The source $S_{SENSE2}$ of the second GaN current sense transistor $GaN_{SENSE2}$ is electrically connected to the source $S_{POWER}$ of the main GaN power transistor $GaN_{POWER}$.

The first GaN current sense transistor $GaN_{SENSE1}$ has a size ratio of 1:K compared to the main GaN power transistor $GaN_{POWER}$ and the second GaN current sense transistor $GaN_{Sense2}$ has a size ratio of 1:N*K compared to the main GaN power transistor $GaN_{POWER}$. Accordingly, the first GaN current sense transistor $GaN_{SENSE1}$ generates a scaled-down (1:K) replica of the current $I_{POWER}$ flowing in the main GaN power transistor $GaN_{POWER}$.

In one embodiment, the channel width of the first GaN current sense transistor $GaN_{SENSE1}$ is in a range of 1:2-100 of the channel width of the main GaN power transistor $GaN_{POWER}$. The second GaN current sense transistor $GaN_{SENSE2}$ also has a scaled down channel width (1:N) compared to the first GaN current sense transistor $GaN_{SENSE1}$ or N*K compared to the main GaN power transistor $GaN_{POWER}$. A current sense circuit 112 included in the second semiconductor die 104 senses the scaled-down replica of the current $I_{POWER}$ flowing in the main GaN power transistor $GaN_{POWER}$ based on a voltage at the first current sense terminal 106 of the GaN die 102 and a voltage at the second current sense terminal 108 of the GaN die 102.

The main GaN power transistor $GaN_{POWER}$ and the GaN current sense transistors $GaN_{SENSE1}$, $GaN_{SENSE2}$ included in the GaN die 102 may be normally-off (i.e., enhancement mode) devices, for example. For a normally-off device, a current conduction channel is not present between the drain and source $D_{POWER}$, $S_{POWER}/D_{SENSE1}$, $S_{SENSE1}/D_{SENSE2}$, $S_{SENSE2}$ of the corresponding GaN transistor $GaN_{POWER}/GaN_{SENSE1}/GaN_{SENSE2}$ without a suitable voltage applied to the gate $G_{POWER}/G_{SENSE1}/G_{SENSE2}$ of the GaN transistor $GaN_{POWER}/GaN_{SENSE1}/GaN_{SENSE2}$.

In one embodiment, the main GaN power transistor $GaN_{POWER}$ and the GaN current sense transistors $GaN_{SENSE1}$, $GaN_{SENSE2}$ are gate injection transistors (GITs) which are hybrid-drain HEMTs (high electron mobility transistors) with a p-GaN gate that results in a normally-off power switch. The gate signal 'Gate' is a gate current injection signal for GIT devices.

In another embodiment, the main GaN power transistor $GaN_{POWER}$ and the GaN current sense transistors $GaN_{SENSE1}$, $GaN_{SENSE2}$ are Schottky-gate HEMTs (high electron mobility transistors) where a p-GaN layer can be either partially depleted by a metal/p-GaN Schottky junction or fully depleted, depending on the doping concentration and thickness of the p-GaN layer. The gate signal 'Gate' is a gate voltage signal for Schottky-gate HEMTs.

The GaN die 102 also includes a diode device 114 electrically connected in series between the drain $D_{POWER}$ of the main GaN power transistor $GaN_{POWER}$ and the drain $D_{SENSE2}$ of the second GaN current sense transistor $GaN_{SENSE2}$. In one embodiment, the diode device 114 is a GaN transistor $GaN_{DIODE}$ having a drain $D_{DIODE}$ electrically connected to the drain $D_{POWER}$ of the main GaN power transistor $GaN_{POWER}$, a source $S_{DIODE}$ electrically connected to the drain $D_{SENSE2}$ of the second GaN current sense transistor $GaN_{SENSE2}$, and a gate $G_{DIODE}$ electrically connected to the drain $D_{DIODE}$ of the GaN transistor $GaN_{DIODE}$. In another embodiment, the diode device 114 is a pn diode PN having an anode electrically connected to the drain $D_{POWER}$ of the main GaN power transistor $GaN_{POWER}$ and a cathode electrically connected to the drain $D_{SENSE2}$ of the second GaN current sense transistor $GaN_{SENSE2}$. The pn diode PN is illustrated with dashed lines in FIG. 1 to indicate that the either the GaN transistor $GaN_{DIODE}$ configured as a HEMT-gated diode or the pn diode PN may be electrically connected in series between the drain $D_{POWER}$ of the main GaN power transistor $GaN_{POWER}$ and the drain $D_{SENSE2}$ of the second GaN current sense transistor $GaN_{SENSE2}$.

In either case, the diode device 114 clamps the voltage at the first resistor R1 which goes to the drain voltage of the main GaN power transistor $GaN_{POWER}$ minus a diode drop when the main GaN power transistor $GaN_{POWER}$ is off. The diode device 114 is in reverse conduction when the main GaN power transistor $GaN_{POWER}$ is on. When the main GaN power transistor $GaN_{POWER}$ is on, a voltage protection device 116 and the second GaN current sense transistor $GaN_{SENSE2}$ in the GaN die 102 act as single switch with twice the resistance in series, resulting in half the current. The diode device 114 enters forward conduction when the main GaN power transistor $GaN_{POWER}$ enters saturation, such that current $I_{SW}$ flows into the voltage protection device 116 from the diode device 114 and into the first resistor R1 when the diode device 114 enters forward conduction. This cause the voltage across the first resistor R1 to rise, providing an indication of main GaN power transistor saturation which is detected by a short circuit detection circuit 118 included in the second semiconductor die 104 without requiring additional readout circuitry or terminals on the GaN die 102.

The diode device 114 included in the GaN die 102 is subject to the same drain voltage as the main GaN power transistor $GaN_{POWER}$ which should cause the second GaN current sense transistor $GaN_{SENSE2}$ to age at the same rate as the main GaN power transistor $GaN_{POWER}$. However, this now causes a high voltage, e.g., go up to 600V or higher on the drain $D_{SENSE2}$ of the second GaN current sense transistor $GaN_{SENSE2}$ which needs to be protected in case the current sense circuit 112 included in the second die 104 and electrically connected to the first and second current sense terminals 102, 104 of the GaN die 102 is implemented using a low voltage technology such as Si (silicon).

The GaN die 102 provides low voltage protection for the current sense circuit 112 included in the second die 104 via a voltage protection device 116. The voltage protection device 116 electrically connects the drain $D_{SENSE2}$ of the second GaN current sense transistor GaN$_{SENSE2}$ to the first sense terminal 102 and protects the current sense circuit 112 from the full drain voltage, e.g., go up to 600V or higher of the main GaN power transistor GaN$_{POWER}$. In one embodiment, the voltage protection device 116 is a GaN transistor GaN$_{SW}$ such as a Schottky-gate HEMT or GIT device having a drain D$_{SW}$ electrically connected to the drain D$_{Sense2}$ of the second GaN current sense transistor G$_{Sense2}$, a source S$_{SW}$ electrically connected to the first current sense terminal 106 of the GaN die 102, and a gate G$_{SW}$ electrically connected to the gate terminal 110 of the GaN die 102. The gate terminal 110 of the GaN die 102 also is electrically connected to the gate G$_{Power}$ of the main GaN power transistor GaN$_{Power}$ and the gate G$_{Sense1}$ of the first GaN current sense transistor GaN$_{SENSE1}$, so that the second semiconductor die 104 drives each of the GaN transistors GaN$_{Power}$, GaN$_{Sense1}$, GaN$_{Sense2}$, GaN$_{SW}$ included in the GaN die 102 with a common gate signal 'Gate'.

The drain charge trapping phenomena associated with GaN-based high electron mobility transistors (HEMTs) is added to the second GaN current sense transistor GaN$_{Sense2}$ and the high voltage protection GaN transistor GaN$_{SW}$ by causing both devices GaN$_{Sense2}$ and GaN$_{SW}$ to see about the same drain voltage as the main GaN power transistor GaN$_{POWER}$ during the OFF phase. In GaN technology, there is a minimum width beyond which matching becomes very poor. In FIG. 1, the Kilis factor is increased by including the high voltage protection GaN transistor GaN$_{SW}$ and using the high voltage protection GaN transistor GaN$_{SW}$ as a sense device (which also has the same OFF phase drain stress), by matching to GaN$_{Sense1}$, GaN$_{Sense2}$ and GaN$_{POWER}$. Such a configuration gives the added benefit that the sum of the two resistances R$_{GaN\_SW}$ and R$_{GaN\_Sense2}$ of GaN$_{SW}$ and GaN$_{Sense2}$ reduces the required sense current, and at the same time doubles the area that matches with the main GaN power transistor GaN$_{POWER}$ and the other sense device GaN$_{Sense1}$. Therefore, the new N ratio becomes:

$$N \cong \frac{R_{GaN\_SW} + R_{GaN\_Sense2}}{R_{GaN\_Sense1}} \quad (1)$$

where R$_{GaN\_Sense1}$ is the resistance of the first GaN current sense transistor GaN$_{Sense1}$.

Consequently, the resistor ratio is designed according to the N factor expressed in equation (1). Another benefit is that the temperature coefficient of the current sense readout circuitry included in the GaN die 102 may be varied with respect to the main GaN power transistor GaN$_{POWER}$. In this case, the temperature coefficients of the GaN current sense transistors GaN$_{Sense1}$, GaN$_{Sense2}$ differ from the temperature coefficient of the main GaN power transistor GaN$_{POWER}$ by changing the values of first and second resistors R1 and R2. Since the second resistor R2 reduces the sense current flowing in the first GaN current sense transistor GaN$_{Sense1}$, the branch that includes the voltage protection device 116 and the second GaN current sense transistor GaN$_{Sense2}$ compensates for the lower sense current such that the sense current is ratio metric (with factor of N*K) with respect to the current I$_{POWER}$ in the main GaN power transistor GaN$_{POWER}$.

Also, the high voltage protection GaN transistor GaN$_{SW}$ and the second GaN current sense transistor GaN$_{Sense2}$ being in parallel to resistor R1 desensitizes the sense current from the aging effects of the high voltage protection GaN transistor GaN$_{SW}$ and the second GaN current sense transistor GaN$_{Sense2}$ because their variation does not cause such a significant impact on the final sense current.

Furthermore, the current through the first GaN current sense transistor GaN$_{Sense1}$ is used for the load and is not current being drawn out of an auxiliary supply V1 included in the second die 104. This allows for dimensioning of the first GaN current sense transistor GaN$_{Sense1}$ to have large enough area for good matching and therefore a better GaN device trap charge distribution uniformity. The embodiment illustrated in FIG. 1 also enables bidirectional current sensing.

The current required for sensing may be minimized by dividing the power current I$_{POWER}$ by the factor K and N, where R1=R2*N. The ratio N may be further increased by using both resistance R$_{GaN\_SW}$ and R$_{GaN\_Sense2}$ as sense fingers. The high voltage protection GaN transistor GaN$_{SW}$ is used both as a switch during the OFF phase to protect low voltage devices of the current sense circuit 112 included in the second die 104 and as a sense finger during the ON phase. Simulations have shown that smaller fingers have a different temperature coefficient as the main GaN power transistor GaN$_{POWER}$, however proper dimensioning of the resistors R1 and R2 allows for adjustment of the temperature coefficient.

The current sense circuit 112 and the short circuit detection circuit 118 included in the second semiconductor die 104 are both electrically connected to the first and second current sense terminals 106, 108 of the GaN die 102 via respective terminals 120, 122 of the second die 104. The second semiconductor die 104 also includes a driver output terminal 124 electrically connected to the gate terminal 110 of the GaN die 102, for proving the common gate signal 'Gate' to the GaN die 102. The common gate signal 'Gate' may be a gate current injection signal for GIT devices or a gate voltage signal for Schottky-gate HEMTs, as previously explained herein.

The short circuit detection circuit 118 included in the second die 104 monitors the voltage across a first resistor R1 connected between the first current sense terminal 106 of the GaN die 102 and ground, to detect when the main GaN power transistor GaN$_{Power}$ is in saturation. The short circuit detection circuit 118 also monitors the voltage across the second resistor R2 connected between the second current sense terminal 108 of the GaN die 102 and ground, to detect when the drain current I$_{POWER}$ of the main GaN power transistor GaN$_{Power}$ exceeds a predetermined value I$_{POWER\_TH}$. Accordingly, the short circuit detection circuit 118 detects excessive drain current conditions via the second current sense terminal 108 of the GaN die 102 and detects saturation of the main GaN power transistor GaN$_{Power}$ via the first current sense terminal 106 of the GaN die 102.

The magnitude of saturation current in the main GaN power transistor GaN$_{Power}$ significantly impacts the short-circuit capability of the main GaN power transistor GaN$_{Power}$. For example, a short-circuit across a load which is connected to the drain D$_{Power}$ of the main GaN power transistor GaN$_{Power}$ causes simultaneous application of a high drain-to-source voltage and a high current that is limited by the magnitude of the current I$_{POWER}$ of the main GaN power transistor GaN$_{Power}$ in saturation. This condition leads to high power dissipation within the main GaN power transistor GaN$_{Power}$ and may result in destructive failure if the fault is not detected and cleared within the withstand time of the device. The short circuit detection circuit 118 included in the second die 104 prevents such destructive failure from occurring, by detecting when the main GaN power transistor GaN$_{Power}$ is in saturation.

The second semiconductor die 104 includes a gate driver 126 to apply the common gate signal 'Gate' to the gate terminal 110 of the GaN die 102. The short circuit detection circuit 118 included in the second die 104 overrides the gate signal 'Gate' if the short circuit detection circuit 118 detects that the main GaN power transistor $GaN_{Power}$ is in saturation. The short circuit detection circuit 118 also overrides the gate signal 'Gate' if the drain current $I_{POWER}$ of the main GaN power transistor $GaN_{Power}$ exceeds a predetermined value $I_{POWER\_TH}$. The main GaN power transistor $GaN_{Power}$ is forced off when the gate signal 'Gate' is overridden.

Figure 2:
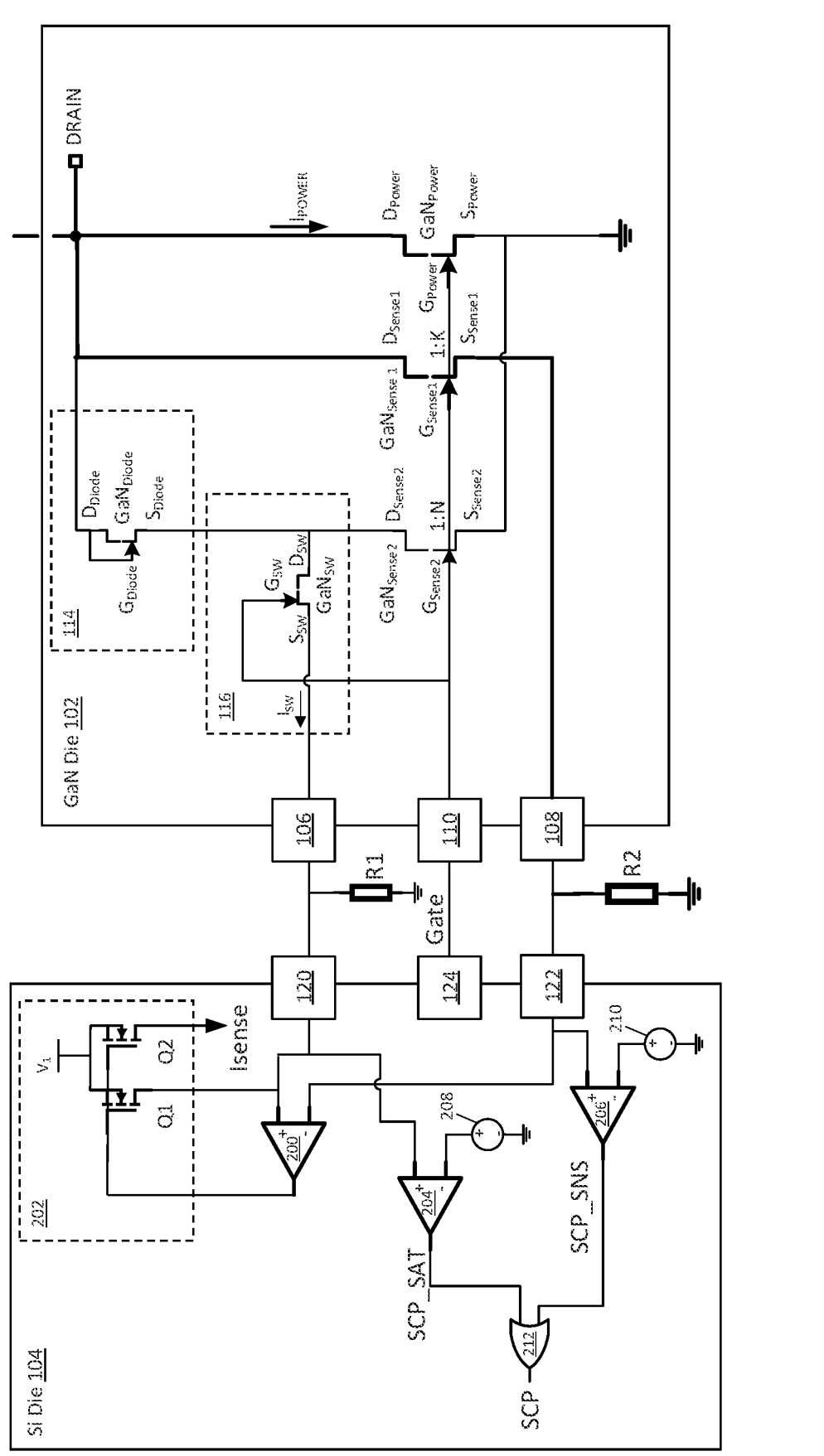
FIG. 2 illustrates a schematic diagram of the power electronics device, according to another embodiment.

FIG. 2 illustrates an embodiment of the current sense circuit 112 and the short circuit detection circuit 118 included in the second semiconductor die 104. In FIG. 2, the current sense circuit 112 includes an operational amplifier 200 having a positive ('+') input electrically connected to the first current sense terminal 106 of the GaN die 106 via the corresponding terminal 120 of the second die 104. The negative ('−') input of the operational amplifier 200 is electrically connected to the second current sense terminal 108 of the GaN die 102 via the corresponding terminal 122 of the second die 104.

The output of the operational amplifier 200 controls a current source circuit 202 of the current sense circuit 112 such that the voltages across the first and second resistors R1 and R2 are approximately equal. The current source circuit 202 is controlled by the output of the comparator 202 and forces a current $I_{SW}$ through the voltage protection device 116 of the GaN die 102. The magnitude of the current sense signal Isense output by the current source circuit 202 is generated to minimize a voltage difference across the first and second current sense terminals 106, 108 of the GaN die 102.

In FIG. 2, the current source circuit 202 includes a first pMOS transistor Q1 and a second pMOS transistor Q2 both controlled by the output of the comparator 200 and having a source electrically connected to a voltage source V1. The drain of the first pMOS transistor Q1 is electrically connected to the first current sense terminal 106 of the GaN die 102 via the corresponding terminal 122 of the second die 104. The drain of the second pMOS transistor Q2 forms a current sense output $I_{SENSE}$ of the current sense circuit 112.

In FIG. 2, the voltage protection device 116 of the GaN die 102 is implemented as a GaN transistor $GaN_{SW}$ that is used exclusively as a switch device and configured to be on when the main GaN power transistor $GaN_{POWER}$ is on and to be off when the main GaN power transistor $GaN_{POWER}$ is off. The drain $D_{SW}$ of the GaN switch device $GaN_{SW}$ is electrically connected to the drain $D_{SENSE2}$ of the second GaN current sense transistor $GaN_{SENSE2}$ and the source $S_{SW}$ of the GaN switch device $GaN_{SW}$ is electrically connected to the first current sense terminal 106 of the GaN die 102. The gate $G_{SW}$ and source $S_{SW}$ of the GaN switch device $GaN_{SW}$ float with the drain $D_{SENSE2}$ of the second GaN current sense transistor $GaN_{SENSE2}$. The current source circuit 202 of the current sense circuit 112 included in the second die 104 sets a current $I_{SW}$ that flows through the GaN switch device $GaN_{SW}$, based on the comparator output. Other types of current sense circuit implementations may be used in the second die 104.

In FIG. 2, the short circuit detection circuit 118 included in the second die 104 includes a first comparator 204 for indicating when the main GaN power transistor $GaN_{POWER}$ in the GaN die 102 is in saturation and a second comparator 206 for indicating when the drain current $I_{POWER}$ of the main GaN power transistor $GaN_{POWER}$ exceeds the predetermined value $I_{POWER\_TH}$. The non-inverting ('+') input of the first comparator 204 is electrically connected to the first current sense terminal 106 of the GaN die 102 via the corresponding terminal 120 of the second die 104. Since the first resistor R1 electrically connects the first current sense terminal 106 of the GaN die 102 to ground, the non-inverting ('+') input of the first comparator 204 corresponds to the voltage across the first resistor R1. The inverting ('−') input of the first comparator 204 is electrically connected to a first reference voltage source 208. The non-inverting ('+') input of the second comparator 206 is electrically connected to the second current sense terminal 108 of the GaN die 102 via the corresponding terminal 122 of the second die 104. Since the second resistor R2 electrically connects the second current sense terminal 108 of the GaN die 102 to ground, the non-inverting ('+') input of the second comparator 206 corresponds to the voltage across the second resistor R2. The inverting ('−') input of the second comparator 206 is electrically connected to a second reference voltage source 210.

The output SCP_SAT of the first comparator 204 goes high when the voltage across the first resistor R1 exceeds the first reference voltage source 208, indicating that the main GaN power transistor $GaN_{POWER}$ in the GaN die 102 is in saturation. The output SCP_SNS of the second comparator 206 goes high when the voltage across the second resistor R2 exceeds the second reference voltage source 210, indicating that the drain current $I_{POWER}$ of the main GaN power transistor $GaN_{POWER}$ exceeds the predetermined value $I_{POWER\_TH}$. Accordingly, the short circuit detection circuit 118 detects saturation of the main GaN power transistor $GaN_{Power}$ via the first comparator 204 and detects excessive drain current conditions at lower drain currents at room and cold temperatures via the second comparator 206.

In FIG. 2, the short circuit detection circuit 118 included in the second die 104 also includes a logic OR gate 212. A first input of the logic OR gate 212 is electrically connected to the output SCP_SAT of the first comparator 204. A second input of the logic OR gate 212 is electrically connected to the output SCP_SNS of the second comparator 206. The output 'SCP' of the logic OR gate 212 goes high when the output SCP_SAT of the first comparator 204 and/or the output SCP_SNS of the second comparator 206 goes high.

The gate signal 'Gate' generated by the gate driver 126 included in the second die 104 is overridden when the output SCP of the logic OR gate 212 goes high, so that the main GaN power transistor $GaN_{POWER}$ in the GaN die 102 is forced off when the logic OR gate output SCP goes high. This allows for safe shutdown of the main GaN power transistor $GaN_{Power}$ within the withstand time of the device, thus avoiding destructive failure. The gate driver 126 is omitted from FIG. 2 to provide a clearer view of the current sense and short circuit detection circuit components.

In more detail, the GaN power transistor $GaN_{POWER}$ included in the GaN die 102 may enter saturation during operation, which for GIT devices happens more frequently at high temperatures. In saturation, the drain voltage of the GaN power transistor $GaN_{POWER}$ rapidly rises and eventually causes the diode device 114 to go into forward conduction such that the current ($I_{SW}$) flows through the voltage protection device 116 and into the first resistor R1. This current causes a voltage drop across the first resistor R1 which is greater than the voltage drop across the second resistor R2. The voltage difference is detected by the operational amplifier 200 of the current sense circuit 112 included in the second semiconductor die 104. Also, the output SCP_SAT of the first comparator 204 of the short circuit detection circuit 118 included in the second die 104 goes high when the voltage drop across the first resistor R1 is greater than the first reference voltage source 208. This in turn causes the output SCP of the logic OR gate 212 of the short circuit detection circuit 118 to go high, indicating that the main GaN power transistor GaN$_{POWER}$ has entered saturation. In response, the logic OR gate output SCP can be used to disable the main GaN power transistor GaN$_{POWER}$ to protect the device against excessive power dissipation.

The second comparator 206 of the short circuit detection circuit 118 triggers at lower drain currents when the drain current I$_{POWER}$ of the main GaN power transistor GaN$_{POWER}$ ramps up slowly (DC case) at room and colder temperatures. Providing both comparators 204, 206 protects the main GaN power transistor GaN$_{POWER}$ and interconnects to the main GaN power transistor GaN$_{POWER}$ such as bond wires from destructive failure over the entire range of operating temperatures.

Although the present disclosure is not so limited, the following numbered examples demonstrate one or more aspects of the disclosure.

Example 1. A power electronics device, comprising: a first semiconductor die comprising: a first current sense terminal; a second current sense terminal; a main GaN (gallium nitride) power transistor; a first GaN current sense transistor having a source electrically connected to the second current sense terminal and a drain electrically connected to a drain of the main GaN power transistor; a second GaN current sense transistor having a source electrically connected to a source of the main GaN power transistor; a diode device electrically connected in series between the drain of the main GaN power transistor and a drain of the second GaN current sense transistor; and a voltage protection device electrically connecting the drain of the second GaN current sense transistor to the first current sense terminal; a second semiconductor die comprising a current sense circuit and a short circuit detection circuit electrically connected to the first and second current sense terminals of the first semiconductor die, wherein the short circuit detection circuit is configured to detect when the drain current of the main GaN power transistor exceeds a predetermined value and when the main GaN power transistor is in saturation.

Example 2. The power electronics device of example 1, wherein the short circuit detection circuit comprises: a first comparator having a first input electrically connected to the first current sense terminal of the first semiconductor die and a second input electrically connected to a first reference voltage source; and a second comparator having a first input electrically connected to the second current sense terminal of the first semiconductor die and a second input electrically connected to a second reference voltage source, wherein an output of the first comparator indicates when the main GaN power transistor is in saturation, wherein an output of the second comparator indicates when the drain current of the main GaN power transistor exceeds the predetermined value.

Example 3. The power electronics device of example 2, wherein the short circuit detection circuit further comprises: a logic OR gate having a first input electrically connected to the output of the first comparator and a second input electrically connected to the output of the second comparator, wherein an output of the logic OR gate goes high when the output of the first comparator and/or the output of the second comparator goes high.

Example 4. The power electronics device of example 3, wherein the second semiconductor die further comprises: a gate driver configured to apply a gate signal to a gate terminal of the first semiconductor die, wherein the gate terminal of the first semiconductor die is electrically connected to a gate of each of the main GaN power transistor, the first GaN current sense transistor, the second GaN current sense transistor, and the voltage protection device, wherein the gate signal is overridden when the output of the logic OR gate goes high, so that the main GaN power transistor is forced off when the output of the logic OR gate goes high.

Example 5. The power electronics device of example 4, wherein each of the main GaN power transistor, the first GaN current sense transistor, the second GaN current sense transistor, and the voltage protection device is a gate injection transistor, and wherein the gate signal is a gate current injection signal.

Example 6. The power electronics device of example 4, wherein each of the main GaN power transistor, the first GaN current sense transistor, the second GaN current sense transistor, and the voltage protection device is a Schottky-gate HEMT (high electron mobility transistor), and wherein the gate signal is a gate voltage signal.

Example 7. The power electronics device of any of examples 2 through 6, further comprising: a first resistor electrically connecting the first current sense terminal of the first semiconductor die to ground, such that the first input of the first comparator corresponds to a voltage across the first resistor; and a second resistor electrically connecting the second current sense terminal of the first semiconductor die to ground, such that the first input of the second comparator corresponds to a voltage across the second resistor.

Example 8. The power electronics device of any of examples 1 through 7, wherein the diode device is a GaN transistor having a drain electrically connected to the drain of the main GaN power transistor, a source electrically connected to the drain of the second GaN current sense transistor, and a gate electrically connected to the drain of the GaN transistor.

Example 9. The power electronics device of any of examples 1 through 7, wherein the diode device is a pn diode having an anode electrically connected to the drain of the main GaN power transistor and a cathode electrically connected to the drain of the second GaN current sense transistor.

Example 10. The power electronics device of any of examples 1 through 9, wherein the diode device is in reverse conduction when the main GaN power transistor is on, wherein the diode device enters forward conduction when the main GaN power transistor enters saturation, and wherein current flows into the voltage protection device from the diode device when the diode device enters forward conduction.

Example 11. The power electronics device of any of examples 1 through 10, wherein the voltage protection device is a GaN transistor having a drain electrically connected to the drain of the second GaN current sense transistor, a source electrically connected to the first current sense terminal of the first semiconductor die, and a gate electrically connected to a gate terminal of the first semiconductor die, wherein the gate terminal of the first semiconductor die also is electrically connected to a gate of the main GaN power transistor and a gate of the first GaN current sense transistor.

Example 12. The power electronics device of any of examples 1 through 11, wherein the current sense circuit comprises: an operational amplifier having a first input electrically connected to the first current sense terminal of the first semiconductor die and a second input electrically connected to the second current sense terminal of the first semiconductor die; and a current source circuit configured to output a current sense signal based on an output of the operational amplifier, wherein a magnitude of the current sense signal is generated to minimize a voltage difference across the first and second current sense terminals of the first semiconductor die.

Example 13. A sensing method for a GaN (gallium nitride) die that includes a main GaN power transistor, a first GaN current sense transistor having a source electrically connected to a second current sense terminal of the GaN die and a drain electrically connected to a drain of the main GaN power transistor, a second GaN current sense transistor having a source electrically connected to a source of the main GaN power transistor, a diode device electrically connected in series between the drain of the main GaN power transistor and a drain of the second GaN current sense transistor, and a voltage protection device electrically connecting the drain of the second GaN current sense transistor to a first current sense terminal of the GaN Die, the sensing method comprising: sensing a scaled-down replica of current flowing in the main GaN power transistor based on a voltage at the first current sense terminal of the GaN die and a voltage at the second current sense terminal of the GaN die; detecting when the main GaN power transistor is in saturation based on the voltage at the first current sense terminal of the GaN die and a first reference voltage; and detecting when the drain current of the main GaN power transistor exceeds a predetermined value based on the voltage at the second current sense terminal of the GaN die and a second reference voltage.

Example 14. The sensing method of example 13, wherein detecting when the main GaN power transistor is in saturation comprises: inputting the voltage at the first current sense terminal of the GaN die and the first reference voltage to a first comparator on a separate die from the GaN die; and outputting, via the first comparator, an indication of when the main GaN power transistor is in saturation, wherein detecting when the drain current of the main GaN power transistor exceeds the predetermined value comprises: inputting the voltage at the second current sense terminal of the GaN die and the second reference voltage to a second comparator on the die as the first comparator; and outputting, via the second comparator, an indication of when the drain current of the main GaN power transistor exceeds the predetermined value.

Example 15. The sensing method of example 14, further comprising: inputting the output of the first comparator and the output of the second comparator to a logic OR gate on the same die as the first and second comparators, wherein an output of the logic OR gate goes high when the output of the first comparator and/or the output of the second comparator goes high.

Example 16. The sensing method of example 15, further comprising: applying a gate signal to a gate terminal of the first semiconductor die, wherein the gate terminal of the first semiconductor die is electrically connected to a gate of each of the main GaN power transistor, the first GaN current sense transistor, the second GaN current sense transistor, and the voltage protection device; and overriding the gate signal when the output of the logic OR gate goes high, so that the main GaN power transistor is forced off when the output of the logic OR gate goes high.

Example 17. The sensing method of example 16, wherein each of the main GaN power transistor, the first GaN current sense transistor, the second GaN current sense transistor, and the voltage protection device is a gate injection transistor, and wherein the gate signal is a gate current injection signal.

Example 18. The sensing method of example 16, wherein each of the main GaN power transistor, the first GaN current sense transistor, the second GaN current sense transistor, and the voltage protection device is a Schottky-gate HEMT (high electron mobility transistor), and wherein the gate signal is a gate voltage signal.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power electronics device, comprising:
a first semiconductor die comprising:
    a first current sense terminal;
    a second current sense terminal;
    a main GaN (gallium nitride) power transistor;
    a first GaN current sense transistor having a source electrically connected to the second current sense terminal and a drain electrically connected to a drain of the main GaN power transistor;
    a second GaN current sense transistor having a source electrically connected to a source of the main GaN power transistor;
    a diode device electrically connected in series between the drain of the main GaN power transistor and a drain of the second GaN current sense transistor; and
    a voltage protection device electrically connecting the drain of the second GaN current sense transistor to the first current sense terminal;

a second semiconductor die comprising a current sense circuit and a short circuit detection circuit electrically connected to the first and second current sense terminals of the first semiconductor die, wherein the short circuit detection circuit is configured to detect when the drain current of the main GaN power transistor exceeds a predetermined value and when the main GaN power transistor is in saturation.

2. The power electronics device of claim 1, wherein the short circuit detection circuit comprises:

a first comparator having a first input electrically connected to the first current sense terminal of the first semiconductor die and a second input electrically connected to a first reference voltage source; and a second comparator having a first input electrically connected to the second current sense terminal of the first semiconductor die and a second input electrically connected to a second reference voltage source, wherein an output of the first comparator indicates when the main GaN power transistor is in saturation, wherein an output of the second comparator indicates when the drain current of the main GaN power transistor exceeds the predetermined value.

3. The power electronics device of claim 2, wherein the short circuit detection circuit further comprises:

a logic OR gate having a first input electrically connected to the output of the first comparator and a second input electrically connected to the output of the second comparator, wherein an output of the logic OR gate goes high when the output of the first comparator and/or the output of the second comparator goes high.

4. The power electronics device of claim 3, wherein the second semiconductor die further comprises:

a gate driver configured to apply a gate signal to a gate terminal of the first semiconductor die, wherein the gate terminal of the first semiconductor die is electrically connected to a gate of each of the main GaN power transistor, the first GaN current sense transistor, the second GaN current sense transistor, and the voltage protection device, wherein the gate signal is overridden when the output of the logic OR gate goes high, so that the main GaN power transistor is forced off when the output of the logic OR gate goes high.

5. The power electronics device of claim 4, wherein each of the main GaN power transistor, the first GaN current sense transistor, the second GaN current sense transistor, and the voltage protection device is a gate injection transistor, and wherein the gate signal is a gate current injection signal.

6. The power electronics device of claim 4, wherein each of the main GaN power transistor, the first GaN current sense transistor, the second GaN current sense transistor, and the voltage protection device is a Schottky-gate HEMT (high electron mobility transistor), and wherein the gate signal is a gate voltage signal.

7. The power electronics device of claim 2, further comprising:

a first resistor electrically connecting the first current sense terminal of the first semiconductor die to ground, such that the first input of the first comparator corresponds to a voltage across the first resistor; and a second resistor electrically connecting the second current sense terminal of the first semiconductor die to ground, such that the first input of the second comparator corresponds to a voltage across the second resistor.

8. The power electronics device of claim 1, wherein the diode device is a GaN transistor having a drain electrically connected to the drain of the main GaN power transistor, a source electrically connected to the drain of the second GaN current sense transistor, and a gate electrically connected to the drain of the GaN transistor.

9. The power electronics device of claim 1, wherein the diode device is a pn diode having an anode electrically connected to the drain of the main GaN power transistor and a cathode electrically connected to the drain of the second GaN current sense transistor.

10. The power electronics device of claim 1, wherein the diode device is in reverse conduction when the main GaN power transistor is on, wherein the diode device enters forward conduction when the main GaN power transistor enters saturation, and wherein current flows into the voltage protection device from the diode device when the diode device enters forward conduction.

11. The power electronics device of claim 1, wherein the voltage protection device is a GaN transistor having a drain electrically connected to the drain of the second GaN current sense transistor, a source electrically connected to the first current sense terminal of the first semiconductor die, and a gate electrically connected to a gate terminal of the first semiconductor die, wherein the gate terminal of the first semiconductor die also is electrically connected to a gate of the main GaN power transistor and a gate of the first GaN current sense transistor.

12. The power electronics device of claim 1, wherein the current sense circuit comprises:

an operational amplifier having a first input electrically connected to the first current sense terminal of the first semiconductor die and a second input electrically connected to the second current sense terminal of the first semiconductor die; and a current source circuit configured to output a current sense signal based on an output of the operational amplifier, wherein a magnitude of the current sense signal is generated to minimize a voltage difference across the first and second current sense terminals of the first semiconductor die.

13. A sensing method for a GaN (gallium nitride) die that includes a main GaN power transistor, a first GaN current sense transistor having a source electrically connected to a second current sense terminal of the GaN die and a drain electrically connected to a drain of the main GaN power transistor, a second GaN current sense transistor having a source electrically connected to a source of the main GaN power transistor, a diode device electrically connected in series between the drain of the main GaN power transistor and a drain of the second GaN current sense transistor, and a voltage protection device electrically connecting the drain of the second GaN current sense transistor to a first current sense terminal of the GaN Die, the sensing method comprising:

sensing a scaled-down replica of current flowing in the main GaN power transistor based on a voltage at the first current sense terminal of the GaN die and a voltage at the second current sense terminal of the GaN die;

detecting when the main GaN power transistor is in saturation based on the voltage at the first current sense terminal of the GaN die and a first reference voltage; and detecting when the drain current of the main GaN power transistor exceeds a predetermined value based on the voltage at the second current sense terminal of the GaN die and a second reference voltage.

14. The sensing method of claim 13, wherein detecting when the main GaN power transistor is in saturation comprises:

inputting the voltage at the first current sense terminal of the GaN die and the first reference voltage to a first comparator on a separate die from the GaN die; and outputting, via the first comparator, an indication of when the main GaN power transistor is in saturation, wherein detecting when the drain current of the main GaN power transistor exceeds the predetermined value comprises:

inputting the voltage at the second current sense terminal of the GaN die and the second reference voltage to a second comparator on the die as the first comparator; and outputting, via the second comparator, an indication of when the drain current of the main GaN power transistor exceeds the predetermined value.

15. The sensing method of claim 14, further comprising:

inputting the output of the first comparator and the output of the second comparator to a logic OR gate on the same die as the first and second comparators, wherein an output of the logic OR gate goes high when the output of the first comparator and/or the output of the second comparator goes high.

16. The sensing method of claim 15, further comprising:

applying a gate signal to a gate terminal of the first semiconductor die, wherein the gate terminal of the first semiconductor die is electrically connected to a gate of each of the main GaN power transistor, the first GaN current sense transistor, the second GaN current sense transistor, and the voltage protection device; and overriding the gate signal when the output of the logic OR gate goes high, so that the main GaN power transistor is forced off when the output of the logic OR gate goes high.

17. The sensing method of claim 16, wherein each of the main GaN power transistor, the first GaN current sense transistor, the second GaN current sense transistor, and the voltage protection device is a gate injection transistor, and wherein the gate signal is a gate current injection signal.

18. The sensing method of claim 16, wherein each of the main GaN power transistor, the first GaN current sense transistor, the second GaN current sense transistor, and the voltage protection device is a Schottky-gate HEMT (high electron mobility transistor), and wherein the gate signal is a gate voltage signal.

* * * * *